United States Patent [19]

Herr et al.

[11] Patent Number: 5,687,178

[45] Date of Patent: Nov. 11, 1997

[54] METHOD AND APPARATUS FOR TESTING A STATIC RAM

[75] Inventors: Lawrence Norman Herr, Coupland; John David Porter; Mary Ann Coones, both of Austin, all of Tex.

[73] Assignee: Motorola, Inc., Schaumburg, Ill.

[21] Appl. No.: 621,370

[22] Filed: Mar. 25, 1996

Related U.S. Application Data

[63] Continuation of Ser. No. 116,192, Sep. 3, 1993, abandoned.

[51] Int. Cl.[6] .................................................. G11C 29/00
[52] U.S. Cl. ........................... 371/21.4; 365/200; 365/201
[58] Field of Search ................................. 371/21.4, 21.2, 371/21.1; 365/200, 201, 189.01

[56] References Cited

U.S. PATENT DOCUMENTS

| | | | |
|---|---|---|---|
| 4,468,759 | 8/1984 | Kung et al. | 365/201 |
| 4,680,762 | 7/1987 | Hardee et al. | 371/28 |
| 4,685,086 | 8/1987 | Tran | 365/203 |
| 4,809,231 | 2/1989 | Shannon et al. | 365/201 |
| 4,903,265 | 2/1990 | Shannon et al. | 371/21.4 |
| 5,034,923 | 7/1991 | Kuo et al. | 365/189.01 |
| 5,097,206 | 3/1992 | Perner | 324/158 |
| 5,155,701 | 10/1992 | Komori et al. | 365/182 |
| 5,159,571 | 10/1992 | Ito et al. | 365/201 |
| 5,255,230 | 10/1993 | Chan et al. | 365/201 |
| 5,276,647 | 1/1994 | Matsui et al. | 365/201 |
| 5,313,430 | 5/1994 | Rawlins et al. | 365/201 |
| 5,339,273 | 8/1994 | Taguchi | 365/201 |

*Primary Examiner*—Robert W. Beausoliel, Jr.
*Assistant Examiner*—Trinh L. Tu
*Attorney, Agent, or Firm*—Daniel D. Hill

[57] ABSTRACT

A method and apparatus for testing a static RAM includes a word line voltage control circuit (42) and an array supply voltage control circuit (46). In response to receiving a first control signal from a tester, the word line voltage control circuit (42) is used to provide a word line voltage to each word line of the memory array (31). The array supply voltage control circuit (46) provides a supply voltage to the array (31) in response to receiving a second control signal from the tester. During testing of memory 30, the array supply voltage and the word line voltage are supplied independently of the memory power supply voltage $V_{DD}$ in order to quickly detect memory cells that are defective due to soft defects.

8 Claims, 3 Drawing Sheets

METHOD AND APPARATUS FOR TESTING A STATIC RAM

This application is a continuation of prior patent application Ser. No. 08/116,192 filed Sep. 3, 1993, now abandoned.

FIELD OF THE INVENTION

This invention relates generally to integrated circuit memories and more particularly to a method and apparatus for testing a static random access memory (SRAM).

BACKGROUND OF THE INVENTION

Static random access memories (SRAMs) are generally used in applications requiring high speed, such as a cache memory in a data processing system. A SRAM is usually implemented as an array of memory cells organized in rows and columns. Each SRAM cell stores one bit of data and is implemented as a pair of inverters having their inputs and outputs cross-coupled at differential storage nodes. The SRAM cell is "bistable", that is, it is stable at one of two possible logic levels. The logic state of the cell is determined by whichever of the two inverter outputs is a logic high, and can be made to change states by applying a voltage of sufficient magnitude and duration to the appropriate cell input.

FIG. 1 illustrates in schematic diagram form, four transistor memory cell 10 in accordance with the prior art. Four transistor memory cell 10 includes polysilicon load resistors 11 and 12, and N-channel transistors 13–16. Resistor 11 has a first terminal connected to a power supply voltage terminal labeled "$V_{DD}$", and a second terminal. Resistor 12 has a first terminal connected to $V_{DD}$, and a second terminal. N-channel transistor 13 has a drain connected to the second terminal of resistor 11 at storage node 101, a gate connected to the second terminal of resistor 12, and a source connected to a power supply voltage terminal labeled "$V_{SS}$". N-channel transistor 14 has a drain connected to the second terminal of resistor 12 and storage node 102, a gate connected to the second terminal of resistor 11, and a source connected to $V_{SS}$. N-channel transistor 15 has a first drain/source terminal connected to a bit line labeled "BL", a second drain/source terminal connected to the second terminal of resistor 11 at storage node 101, and a gate connected to a word line labeled "WL". N-channel transistor 16 has a first drain/source terminal connected to a bit line labeled "BL*", a second drain/source terminal connected to the second terminal of resistor 12 at storage node 102, and a gate connected to word line WL. (Note that an asterisk "*" after a signal or line name indicates that the signal or line is a logical complement of a signal or line having the same name but lacking the asterisk "*".)

To write a data bit into cell 10, word line WL is provided with a logic high voltage, causing coupling transistors 15 and 16 to be conductive. A logic high voltage is typically equal to about the power supply voltage and a logic low voltage is equal to zero volts. The data bit stored in cell 10 is over-written by applying a differential voltage to bit line pair BL/BL* that is sufficiently large to cause storage nodes 101 and 102 to change logic states if necessary. Assume, for example, that a logic one is to be written into cell 10. Bit line BL is provided as a logic high voltage and bit line BL* is provided as a logic low voltage. The logic high voltage of bit line BL is provided to the drain of pull down transistor 13 at node 101, and to the gate of pull down transistor 14. The logic low voltage of bit line BL* is provided to the drain of pull down transistor 14 and to the gate of pull-down transistor 13. Pull down transistor 14 is conductive, causing storage node 102 to be coupled to $V_{SS}$. Pull down transistor 13 is substantially non-conductive, causing storage node 101 to be at a logic high voltage. The logic high voltage at storage node 101 keeps the gate of pull down transistor 14 at a logic high voltage, thus latching cell 10 in a relatively stable state until over-written during another write cycle.

To read cell 10, bit line pair BL/BL* is precharged and equalized to a voltage approximately equal to $V_{DD}$, or as low as $V_{DD}$ minus a threshold voltage ($V_T$) by bit line loads (not shown). Word line WL is at a logic high voltage. When word line WL is a logic high voltage, coupling transistors 15 and 16 are conductive, which causes storage nodes 101 and 102 to be coupled to bit line pair BL/BL*. In the case where storage node 101 is a logic high voltage and storage node 102 is a logic low voltage, bit line BL remains at a logic high voltage, and bit line BL* is pulled low through coupling transistor 16, causing a small differential voltage corresponding to a logic one to be read from cell 10.

SRAM cell 10 should be sufficiently stable to prevent the logic state of the stored data bit from changing during a read operation of cell 10, or while cell 10 is in the storage mode. If the cell has inadequate noise margins, the logic state that is stored in cell 10 may be inadvertently changed, such as when cell 10 is accessed for a read operation.

The stability of cell 10 may be described in terms of three stability modes: a storage mode; an active mode; and a transition mode. A SRAM cell is operating in the storage mode when it is not being accessed during a read or a write cycle. Conversely, a cell is operating in the active mode when it is being accessed during a read or a write cycle. A cell is operating in the transition mode when it is transitioning from the active mode to the storage mode, or from the storage mode to the active mode. There are static noise margins associated with each of these operating modes that determine the stability of the cell.

When cell 10 is in the storage mode, the voltage on word line WL is a logic low, so that coupling transistors 15 and 16 are substantially non-conductive, which isolates storage nodes 101 and 102 from the influence of bit line pair BL/BL*. The static noise margin during the storage mode varies depending on the power supply voltage, the threshold voltage ($V_T$) variation between pull down transistors 13 and 14, and the variation in resistance between polysilicon load resistors 11 and 12. Also, the storage mode static noise margin can degrade over time if, for example, the cell has defects that cause an excessive leakage current in the cell.

When cell 10 is in the active mode, the word line voltage is a logic high, causing coupling transistors 15 and 16 to be conductive. Storage nodes 101 and 102 are coupled to bit lines, BL and BL*, respectively, and SRAM cell 10 will either be undergoing a read operation or a write operation. The static noise margin during the active mode is a function of the power supply voltage, the conductance ratio of coupling transistor 15 and pull down transistor 13 with a maximum gate voltage of pull down transistor 13 being set by the $V_T$ of coupling transistor 15, the conductance ratio of coupling transistor 16 to pull down transistor 14 with the maximum gate voltage of pull down transistor 14 being set by the $V_T$ of coupling transistor 16, and the amount of mismatch between the $V_T$ and conductance of pull down transistors 13 and 14, where the amount of mismatch is controlled by process and layout considerations.

When cell 10 is transitioning between the storage mode and the active mode, the word line voltage is greater than $V_{SS}$, but less than $V_{DD}$. As the word line voltage increases, the static noise margin associated with the storage mode degrades. As the word line voltage continues to increase, the storage mode static noise margin starts to become negative. As the storage mode static noise margin becomes negative, the active mode static noise margin should be positive to prevent the cell from becoming unstable and inadvertently changing logic states. In other words, the active mode static noise margin should "overlap" the storage mode static noise margin. Typically, the storage mode static noise margin should remain positive with word line voltages less than or equal to 3.0 volts, assuming a power supply voltage that is approximately equal to 5.0 volts. There should be sufficient static noise margin in each mode to allow for process variations such as misalignment, $V_T$ variation, $W_{EFF}$ and effective channel length ($L_{EFF}$) limits, and for all design power supply strapping positions.

During fabrication, SRAM cells are commonly tested by writing a predetermined pattern of data, and then reading the data. If the predetermined pattern has changed, the memory has defective cells. Probe testers are commonly used for testing the memory array for defective cells. Defects such as opens or shorts in the cell are relatively easy to detect. However, some defects do not cause easily detectable failures when using standard testing techniques. These defects are sometimes called "soft defects". So called soft defects are difficult to detect because they may not lead to failure of the cell, and may only appear during certain conditions. In addition, the conditions that cause failures due to soft defects may be difficult to recreate during testing. For example, a soft defect may cause a leakage current to flow through the cell. This leakage current may cause the cell to fail if the cell has been in storage mode for a certain length of time. In the past, this type of soft defect has been detected by first writing a predetermined pattern into the memory array, waiting for a certain amount of time, and then detecting if the predetermined pattern has changed. However, a waiting period of as long as 30 seconds may be required. A probe test procedure that requires a 30 second waiting period may substantially increase the time required to test the memory.

Some soft defects may appear only during the transition mode of operation, that is, when the word line voltage is at an intermediate voltage between $V_{SS}$ and $V_{DD}$. For example, during normal operation of a memory, the address signals may become skewed due to incorrect timing, high speed operation, or both. If certain row address signals become skewed, internal row address signals may overlap, which may cause low amplitude "pulses" to appear on some of the word lines. These low amplitude pulses may effectively cause the cells to be in the transition mode for a relatively long period of time. Weak or defective cells that function correctly in the active mode operation and in the storage mode of operation may fail in the transition mode due to address signal skewing. These types of defects are difficult and time consuming to detect using standard probe testing procedures.

SUMMARY OF THE INVENTION

Accordingly, there is provided, in one form, a method for testing a static random access memory array for defective memory cells. Each memory cell of the array being tested is coupled to a bit line pair and to a word line. The word line conducts a word line voltage when accessing a memory cell. Each memory cell is also coupled to a power supply voltage terminal. A first power supply voltage is provided to the power supply voltage terminal. A data bit having a first logic state is written into a memory cell of the array. A second power supply voltage is provided to the power supply voltage terminal, where the second power supply voltage has a lower potential than the first power supply voltage. A data bit having a second logic state is written into the memory cell while the memory array is being supplied with the second power supply voltage. The word line voltage is provided to the word line. The word line voltage has a potential lower than the potential of the first power supply voltage. The logic state of the data bit is detected to determine if it has changed to a logic state that is different than the second logic state. In another form, an apparatus for testing a static random access memory is provided. These and other features and advantages will be more clearly understood from the following detailed description taken in conjunction with the accompanying drawings.

DESCRIPTION OF A PREFERRED EMBODIMENT

Figure 1:
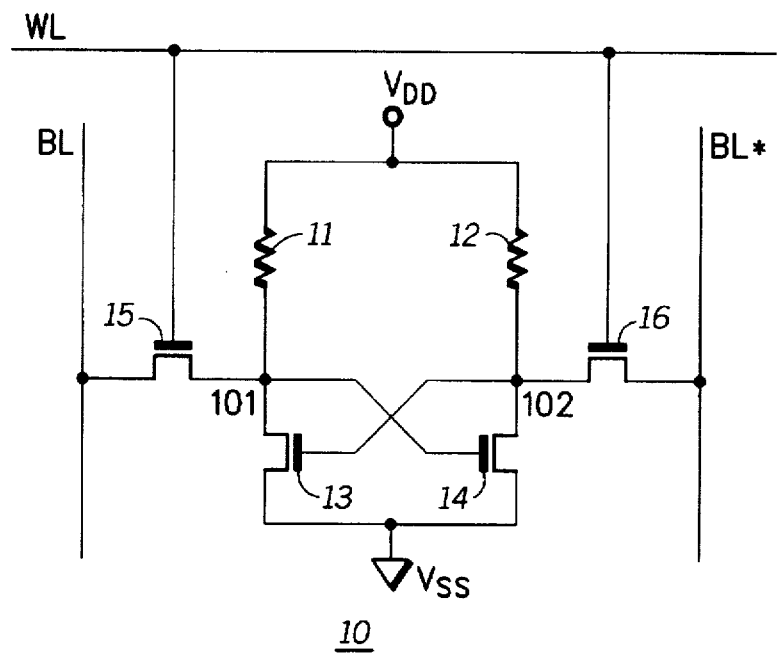
FIG. 1 illustrates in schematic diagram form an SRAM cell in accordance with the prior art.
Figure 2:
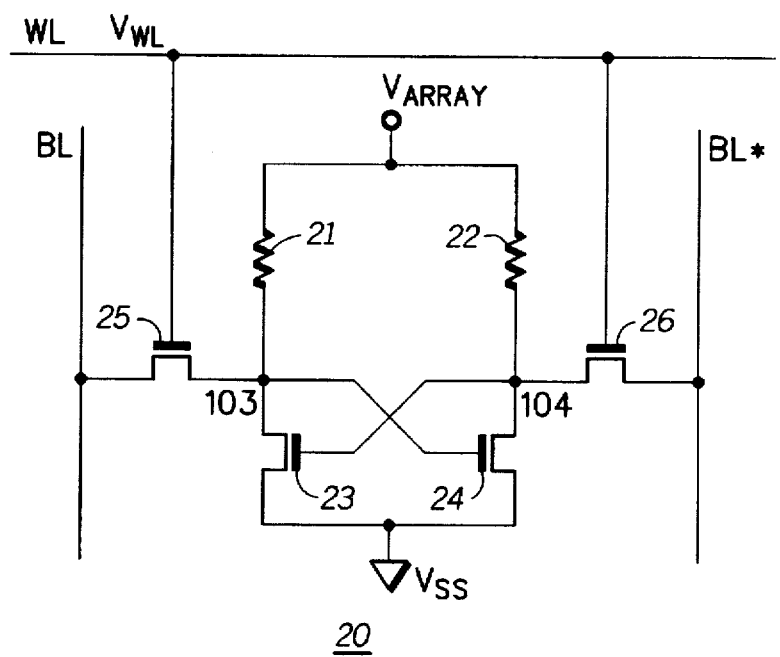
FIG. 2 illustrates in schematic diagram form an SRAM cell in accordance with the present invention.

FIG. 2 illustrates in schematic diagram form, four transistor memory cell 20 in accordance with the present invention. Four transistor memory cell 20 includes polysilicon load resistors 21 and 22, and N-channel transistors 23–26. Resistor 21 has a first terminal connected to a memory array supply voltage labeled "$V_{ARRAY}$", and a second terminal. Resistor 22 has a first terminal connected to $V_{ARRAY}$, and a second terminal. N-channel transistor 23 has a drain connected to the second terminal of resistor 21 at node 103, a gate connected to the second terminal of resistor 22, and a source connected to $V_{SS}$. N-channel transistor 24 has a drain connected to the second terminal of resistor 22 and node 104, a gate connected to the second terminal of resistor 21, and a source connected to $V_{SS}$. N-channel transistor 25 has a first drain/source terminal connected to a bit line labeled "BL", a second drain/source terminal connected to the second terminal of resistor 21 at node 103, and a gate connected to a word line labeled "WL". Word line WL receives a word line voltage labeled "$V_{WL}$". N-channel transistor 26 has a first drain/source terminal connected to a bit line labeled "BL*", a second drain/source terminal connected to the second terminal of resistor 22 at node 104, and a gate connected to word line WL.

During normal read and write operations, memory cell 20 operates like prior art memory cell 10, with $V_{ARRAY}$ and $V_{WL}$ both having a voltage potential equal to about $V_{DD}$. However, during probe testing of memory 30, the word line and memory array supply voltages are provided to the memory array by the probe tester, and can be varied without affecting the operation of peripheral circuitry. The peripheral circuitry includes address buffers, address decoders, and data input and output circuits. By independently supplying the array and word line voltages with the probe tester, greater flexibility is achieved during testing. The time required for testing is reduced because degraded, or reduced, voltage levels may be used. By utilizing degraded voltage levels during testing, the waiting period required for detecting defective cells caused by soft errors is reduced. In addition, word line voltage $V_{WL}$ may provided at reduced, or degraded levels to simulate undesirable address signal skewing to detect defects that cause insufficient transition mode static noise margin.

Figure 3:
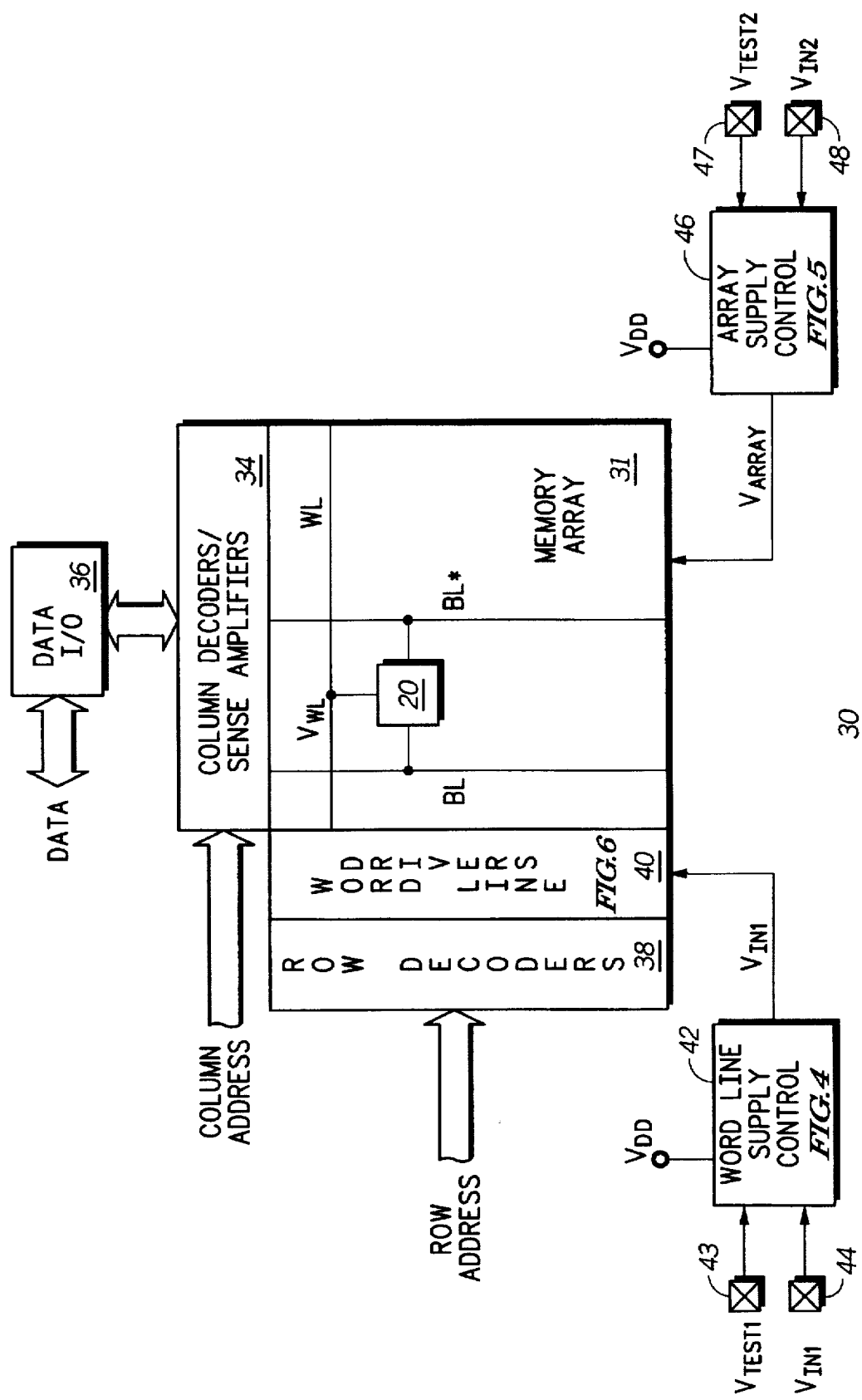
FIG. 3 illustrates in block diagram form a memory in accordance with the present invention.
Figure 6:
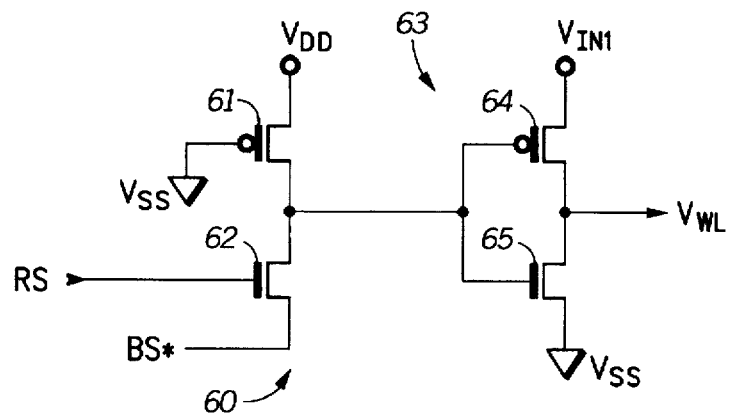
FIG. 6 illustrates in schematic diagram form an embodiment of a word line driver circuit of the memory of FIG. 3.

FIG. 3 illustrates in block diagram form memory 30 in accordance with the present invention. Memory 30 includes memory array 31, column decoders/sense amplifiers 34, data input/output circuit 36, row decoders 38, word line drivers 40, word line voltage control circuit 42, and memory array supply voltage control circuit 46. Memory cells are located at intersections of word lines and bit line pairs. Representative memory cell 20 (FIG. 2) is illustrated coupled to a word line labeled "WL", and to a bit line pair, with one bit line labeled "BL" and the other bit line labeled "BL*". Row decoders 38 receive a row address, and in response, provide a row select signal to select a word line of memory array 31. Word line drivers 40 includes a plurality of word line driver circuits, each of the word line driver circuits including a first input terminal for receiving a row select signal from row decoders 38, and a second input terminal for receiving a word line supply voltage labeled "$V_{WL}$". An embodiment of a word line driver circuit is illustrated in FIG. 6 and will be discussed later. Column decoders/sense amplifier 34 receives a plurality of column address signals labeled "COLUMN ADDRESS", and in response selects a bit line pair for reading data from the selected bit line pair during a read operation of memory 30, or for writing data to the selected bit line pair during a write operation of memory 30. When reading data from memory 30, the sense amplifiers of column decoders/sense amplifiers 34 detects and amplifies the relatively small differential signals from a selected bit line pair. Also included in memory 30 are bit line equalization and precharge circuits (not shown). Note that the amount of address decoding and/or predecoding performed by row decoders 38 and column decoders/sense amplifiers 34 is not significant and may be different in other embodiments.

Word line voltage control circuit 42 includes a first input terminal coupled to test pad 43 for receiving a first control signal labeled "$V_{TEST1}$", a second input terminal coupled to test pad 44 for receiving a first voltage labeled "$V_{IN1}$", a power supply voltage terminal labeled "VDD" for receiving a power supply voltage, and an output terminal for providing word line supply voltage $V_{WL}$. Memory array supply voltage control circuit 46 includes a first input terminal coupled to test pad 47 for receiving a second control signal labeled "$V_{TEST2}$", a second input terminal coupled to test pad 48 for receiving a second voltage labeled "$V_{IN2}$", power supply voltage terminal $V_{DD}$, for receiving the power supply voltage, and an output terminal for providing memory array supply voltage $V_{ARRAY}$.

During the fabrication process, memory 30 is tested for defective cells using a probe tester. Probe testing is commonly done at "wafer level" during the fabrication of integrated circuit memories. The purpose of wafer level probe testing is to determine, as early as possible in the fabrication process, whether each individual "die" has defective cells. The earlier a defective die is detected, the less time and money wasted on further processing. The presently available probe test equipment contacts bonding pads on each individual die on the wafer using a separate probe needle for each pad on the die. Test pads 43, 44, 47, and 48 are contacted during probe testing of memory 30 along with the other test pads of memory 30 (not shown). Word line voltage control circuit 42 is used during the probe test to supply a variable voltage to the word lines of memory 30. The voltage provided to the word lines may be varied as required by the particular test step. Likewise, memory array supply voltage control circuit 46 is used during probe testing to provide a variable supply voltage to memory array 31.

After the wafer is positioned on the probe tester, test probes contact the test pads on the die. The test pads provide the address signals, control signals, and data required for testing, and include test pads 43, 44, 47, and 48. Control signals $V_{TEST1}$ and $V_{TEST2}$ are provided to test pads 43 and 47 by the probe tester. When control signal $V_{TEST1}$ is a logic low, word line voltage $V_{WL}$ is equal to approximately the power supply voltage being provided to power supply voltage terminal $V_{DD}$. When control signal $V_{TEST1}$ is a logic high voltage, word line voltage $V_{WL}$ is approximately equal to voltage $V_{IN1}$. Voltage $V_{IN1}$ is provided by the probe tester to test pad 44. When control signal $V_{TEST2}$ is equal to a logic low voltage, array supply voltage $V_{ARRAY}$ is equal to approximately the power supply voltage being provided to power supply voltage terminal $V_{DD}$. When control signal $V_{TEST2}$ is provided as a logic high voltage, array supply voltage $V_{ARRAY}$ is equal to voltage $V_{IN2}$. Voltage $V_{IN2}$ is provided by the probe tester to test pad 48.

To test memory array 31 according to a preferred embodiment of the present invention, control signals $V_{TEST1}$ and $V_{TEST2}$ are provided as logic low voltages, causing normal voltage levels to be provided to the word lines and to the array. A first predetermined logic state is written into each memory cell of memory array 31 with control signals $V_{TEST1}$ and $V_{TEST2}$ at the logic low voltage. The first predetermined logic state may be a test pattern comprising all logic "ones", or all logic "zeros", or any combination thereof. After the first predetermined logic state is written into each cell of memory array 31 with the array and the word lines at normal voltage levels, control signal $V_{TEST2}$ is provided as a logic high, and a voltage $V_{IN2}$ is provided to test pad 48. Voltage $V_{IN2}$ is a reduced, or intermediate voltage, relative to $V_{DD}$. Each cell of memory array 31 is then rewritten with a second predetermined logic state while voltage $V_{IN2}$ is at the intermediate voltage level. The second predetermined logic state is the opposite of the first predetermined logic state. Control signal $V_{TEST1}$ is then provided as a logic high voltage. When control signal $V_{TEST1}$ is a logic high, voltage $V_{IN1}$ is provided to test pad 44 by the probe tester. Voltage $V_{IN1}$ is provided at an intermediate, or reduced voltage level. Each cell of memory array 31 is read while voltages $V_{IN1}$ and $V_{IN2}$ are at the intermediate level. Control signals $V_{TEST1}$ and $V_{TEST2}$ are then returned to logic low voltages, thus providing word line drivers 40 and memory array 31 with a supply voltage equal to approximately $V_{DD}$. Each memory cell of memory array 31 is read a second time to detect if the second predetermined logic pattern has changed. If the second predetermined pattern has changed, there are defective cells in memory array 31.

Voltage $V_{IN1}$ is provided at an intermediate, or reduced voltage level, in order to simulate the reduced, or degraded, word line voltage that may occur as a result of address signal skewing. Voltage $V_{IN2}$ is at a reduced level relative to $V_{DD}$ in order to reduce time to failure by maintaining degraded voltage levels in each cell of the array. As a result, the time required to test the array for defective cells is reduced. Reading the contents of the array with word line voltage $V_{WL}$ at the intermediate voltage level makes it more likely for cells having soft defects to fail due to insufficient transition mode static noise margin.

During normal operation of memory 30, test pads 43, 44, 47, and 48 are not used, and memory 30 functions as a conventional static random access memory having write cycles and read cycles.

Figure 4:
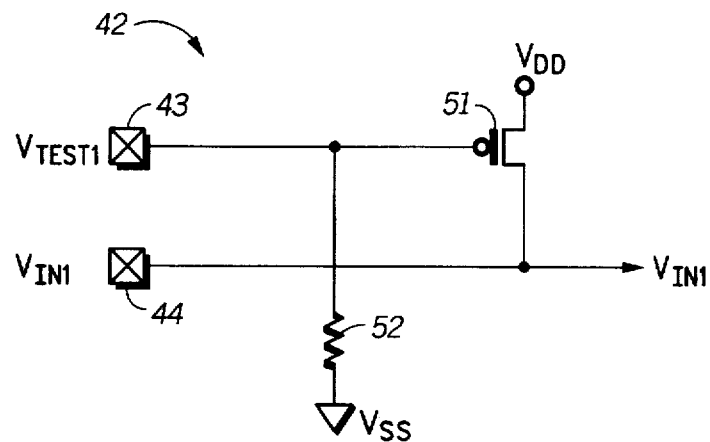
FIG. 4 illustrates in schematic diagram form an embodiment of the word line voltage control circuit of FIG. 3.

FIG. 4 illustrates in schematic diagram form an embodiment of the word line supply voltage control circuit of FIG. 3. Word line supply voltage control circuit 42 includes test pads 43 and 44, P-channel transistor 51, and resistor 52. P-channel transistor 51 has a source connected to $V_{DD}$, a gate connected to test pad 43 for receiving first control signal $V_{TEST1}$, and a drain connected to test pad 44 for providing voltage $V_{IN1}$. Resistor 52 has a first terminal connected to the control electrode of P-channel transistor 51, and a second terminal connected to $V_{SS}$.

When a logic low control voltage $V_{TEST1}$ is provided to test pad 43, P-channel transistor 51 of word line supply voltage control circuit 42 is conductive. Test pad 44 is left floating, therefore, the power supply voltage provided at power supply voltage terminal $V_{DD}$ is provided as voltage $V_{IN1}$. When control signal $V_{TEST1}$ is a logic high voltage, P-channel transistor 51 is substantially non-conductive. Voltage $V_{IN1}$ is equal to a voltage provided by the probe tester. Voltage $V_{IN1}$ is then provided to word line driver circuit 60 (FIG. 6). Test pads 43 and 44 are only used during probe test. After completing probe testing, word line voltage control circuit 42 is no longer used. Test pads 43 and 44 therefore remain unterminated. Resistor 52 is provided to ensure that P-channel transistor 51 remains conductive in order to supply word line drivers 40 with a voltage equal to approximately $V_{DD}$ during normal operation of memory 30.

Figure 5:
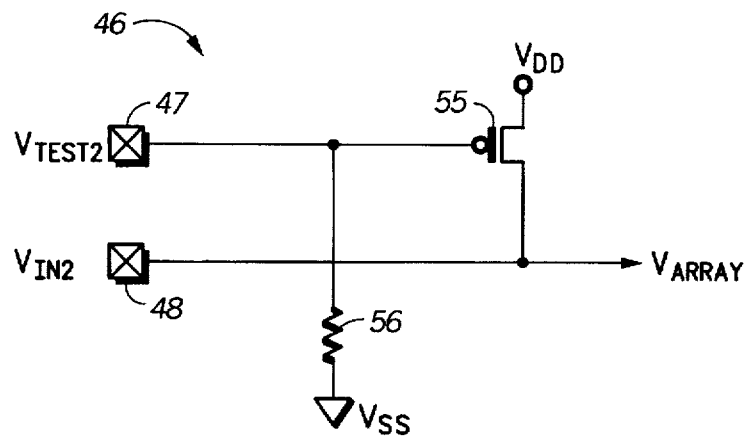
FIG. 5 illustrates in schematic diagram form an embodiment of the memory array supply voltage control circuit of the memory of FIG. 3.

FIG. 5 illustrates in schematic diagram form an embodiment of memory array supply voltage control circuit 46 of memory 30 of FIG. 3. Memory array supply voltage control circuit 46 includes test pads 47 and 48, P-channel transistor 55, and resistor 56. P-channel transistor 55 has a source connected to $V_{DD}$, a gate connected to test pad 47 for receiving second control signal $V_{TEST2}$, and a drain connected to test pad 48 for providing voltage $V_{IN2}$. Resistor 56 has a first terminal connected to the control electrode of P-channel transistor 55, and a second terminal connected to $V_{SS}$.

When a logic low control voltage $V_{TEST2}$ is provided to test pad 47, P-channel transistor 55 of memory array supply voltage control circuit 46 is conductive. Test pad 48 is left floating, therefore, the power supply voltage provided at power supply voltage terminal $V_{DD}$ is provided as memory array supply voltage $V_{ARRAY}$. When control signal $V_{TEST2}$ is a logic high voltage, P-channel transistor 55 is substantially non-conductive. Array supply voltage $V_{ARRAY}$ is equal to voltage $V_{IN2}$. Resistor 56 ensures that P-channel transistor 55 is always conductive when test pads 47 and 48 are left unterminated after testing is complete. Note that voltage $V_{IN1}$ and voltage $V_{IN2}$ are provided by the probe tester, and can be any voltage. However, in a preferred embodiment, voltage $V_{IN1}$ is chosen to be an intermediate voltage equal to about 2.9 to 3.1 volts for a power supply voltage of about 5.0 volts.

FIG. 6 illustrates in schematic diagram form an embodiment of a word line driver circuit 60. Word line driver circuit 60 includes P-channel transistor 61, N-channel transistor 62, and inverter 63. P-channel transistor 61 has a source connected to $V_{DD}$, a gate connected to $V_{SS}$, and a drain. N-channel transistor 62 has a drain connected to the drain of P-channel transistor 61, a gate for receiving a row select signal labeled "RS", and drain for receiving an address signal labeled "BS*". Inverter 63 has an input terminal connected to the drain of P-channel transistor 61, and an output terminal for providing word line voltage $V_{WL}$.

Inverter 63 includes P-channel transistor 64 and N-channel transistor 65. P-channel transistor 64 has a source connected to the drain of P-channel transistor 51 of word line voltage control circuit 42 (FIG. 4), a gate connected to the drain of P-channel transistor 61, and a drain for providing word line voltage $V_{WL}$. N-channel transistor 65 has a drain connected to the drain of P-channel transistor 64, a gate connected to the gate of P-channel transistor 64, and a source connected to $V_{SS}$.

Word line driver circuit 60 receives row select signal RS from a row address predecoder (not shown), a block select address signal BS*, and provides word line voltage $V_{WL}$. The potential of word line voltage $V_{WL}$ depends on voltage $V_{IN1}$ from word line voltage control circuit 42 (FIG. 4). During a probe test of memory 30, row select signal RS and address signal BS* is provided to word line driver circuit 60 when the word line connected to word line driver circuit 60 is selected. Note that in a preferred embodiment, address signal BS* is a block select signal and is used to select a block, or section of memory array 31 to be accessed. The memory cells connected to word line WL are accessed when word line voltage $V_{WL}$ is equal to a logic high voltage, thus causing the access transistors of the cell to be conductive. In operation, P-channel transistor 61 is conductive when its gate-source voltage ($V_{GS}$) is greater than a threshold voltage ($V_T$), or about 1.0 volt. When row select signal RS is a logic high voltage, and address signal BS* is a logic low voltage, the $V_{GS}$ of N-channel transistor 62 is greater than $V_T$, causing N-channel transistor 62 to be conductive. The channel width of N-channel transistor 62 is larger than the channel width of P-channel transistor 61. Therefore, when row select signal RS is a logic high, the conductance of N-channel transistor 62 is larger than the conductance of P-channel transistor 61. This causes a logic low voltage to be provided to the input terminal of inverter 63, causing a logic high word line voltage $V_{WL}$ to be provided to the word line.

As discussed above, a series of low amplitude pulses on the word line can be interpreted by the cell as an intermediate DC voltage level, where the intermediate DC voltage level may cause the cell to effectively operate in transition mode. A low amplitude pulse can be generated at the output terminal of inverter 63 by momentarily providing a logic high row select signal RS and a logic low address signal BS*. As can be seen, these low amplitude pulses can occur during normal operation of memory 30 if row select signal RS and address signal BS* are inadvertently skewed. Providing voltage $V_{WL}$ at the reduced, or intermediate voltage level can be used to simulate address signal skewing, and make it more likely for cells having soft defects to fail due to insufficient transition mode static noise margin.

In summary, the array supply voltage and the word line voltage is provided at reduced levels relative to $V_{DD}$ during probe testing. The reduced voltages degrade the static noise margins of the memory cells, causing cells having soft defects to be more likely to fail during testing. Also, by using a reduced word line voltage relative to $V_{DD}$ and a reduced supply voltage relative to $V_{DD}$, the time required for testing is reduced, since degraded levels are written and maintained in the cells. Also, the waiting period associated with standard probe testing techniques for detecting soft defects is reduced. In addition, word line supply voltage $V_{WL}$ and array supply voltage $V_{ARRAY}$ can be varied without affecting the operation of the peripheral circuits of the memory. Also, in other embodiments, word line supply voltage $V_{WL}$ and array supply voltage $V_{ARRAY}$ may be provided at a voltage having a magnitude greater than $V_{DD}$ for use in reliability testing.

While the invention has been described in the context of a preferred embodiment, it will be apparent to those skilled in the art that the present invention may be modified in numerous ways and may assume many embodiments other than that specifically set out and described above. For example, the testing method of the present invention may also be implemented during final testing after packaging by using external pins rather than test pads on the die. Accordingly, it is intended by the appended claims to cover all modifications of the invention which fall within the true spirit and scope of the invention.

What is claimed is:

1. An integrated circuit memory for storing information having a plurality of memory cells coupled to bit lines and to word lines, the plurality of memory cells having a power supply terminal for receiving a power supply voltage, the memory comprising:

a plurality of word line driver circuits for providing a word line voltage to the word lines in response to receiving an address signal;

a supply voltage control circuit coupled to the power supply terminal of the plurality of memory cells, the supply voltage control circuit for providing the power supply voltage at a first potential in response to receiving a first control signal at a first logic state, and for providing the power supply voltage at a second potential in response to the first control signal at a second logic state, wherein the first potential is lower than the second potential and the power supply voltage of the first potential is provided to the plurality of memory cells during testing of the integrated circuit memory; and a word line drive voltage control circuit coupled to the plurality of word line driver circuits, the word line drive voltage control circuit for supplying a first supply voltage to the plurality of word line driver circuits in response to receiving a second control signal at a first logic state, and for providing a second voltage to the plurality of word line driver circuits in response to receiving the second control signal at a second logic state, wherein the first voltage is lower than the second voltage and is provided to the plurality of word line driver circuits during testing of the integrated circuit memory.

2. The memory of claim 1, further comprising a first test pad, coupled to the supply voltage control circuit, for receiving the first control signal and a second test pad, coupled to the supply voltage control circuit for receiving the power supply voltage of the first potential.

3. The memory of claim 2, further comprising a third test pad, coupled to the word line drive voltage control circuit, for receiving the first second control signal and a fourth test pad, coupled to the word line drive voltage control circuit for receiving the first voltage.

4. The memory of claim 1, wherein the plurality of memory cells comprises a plurality of static random access memory cells.

5. The memory of claim 1, wherein the first voltage is variable between zero volts and the second voltage.

6. A static random access memory having an array of memory cells for storing information, each memory cell coupled to a word line and a bit line pair, the memory comprising:

a power supply voltage terminal for receiving a power supply voltage;

a first control circuit having an output terminal coupled to the memory array, a first input terminal coupled to the power supply voltage terminal, a second input terminal for receiving a first test voltage, the first control circuit providing the power supply voltage to the memory array in response to a first control signal being in a first logic state, and providing the first test voltage to the memory array in response to the first control signal being in a second logic state;

a word line driver circuit for providing a word line voltage to one of the word lines in response to receiving an address signal; and a second control circuit, having an output terminal coupled to the word line driver circuit, a first input terminal coupled to the power supply voltage terminal, a second input terminal for receiving a second test voltage, the second control circuit for providing the power supply voltage to the word line driver circuit in response to a second control signal being in a first logic state, and providing the second test voltage to the word line driver circuit in response to the second control signal being in a second logic state;

wherein the first and second control signals are generated by a source that is external to the static random access memory during testing of the static random access memory, and a magnitude of the first and second test voltages is lower than a magnitude of the power supply voltage.

7. The memory of claim 6, further comprising first and second test pads, the first and second test pads coupled to the first and second control circuits for receiving the first and second test voltages, respectively, and third and fourth test pads, coupled to the first and second control circuits, for receiving the first and second control signals, respectively.

8. The memory of claim 7, wherein the first and second test voltages and the first and second control signals are provided by a probe tester.

* * * * *